United States Patent
Yeh et al.

(10) Patent No.: US 7,721,166 B2
(45) Date of Patent: May 18, 2010

(54) METHOD FOR MANAGING DEFECT BLOCKS IN NON-VOLATILE MEMORY

(75) Inventors: Szu I Yeh, Hsinchu (TW); Hsin Jen Huang, Hsinchu (TW); Chien Cheng Lin, Hsinchu (TW); Chia Hao Lee, Hsinchu (TW); Chih Nan Yen, Hsinchu (TW); Fuja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 282 days.

(21) Appl. No.: 12/057,234

(22) Filed: Mar. 27, 2008

(65) Prior Publication Data

US 2009/0249140 A1    Oct. 1, 2009

(51) Int. Cl.
*G11C 29/00* (2006.01)
(52) U.S. Cl. .................. 714/723; 714/710
(58) Field of Classification Search .......... 711/103; 235/492; 369/53.17; 714/718, 8, 154, 723, 714/710

See application file for complete search history.

(56) References Cited

U.S. PATENT DOCUMENTS

| | | | |
|---|---|---|---|
| 7,073,091 B2 * | 7/2006 | Lee | 714/8 |
| 7,251,712 B2 * | 7/2007 | Unno | 711/154 |
| 7,281,114 B2 * | 10/2007 | Kita | 711/203 |
| 7,654,466 B2 * | 2/2010 | Maeda et al. | 235/492 |
| 2006/0146675 A1 * | 7/2006 | Shin | 369/53.17 |
| 2009/0150599 A1 * | 6/2009 | Bennett | 711/103 |

* cited by examiner

*Primary Examiner*—David Ton
(74) *Attorney, Agent, or Firm*—WPAT, P.C.; Anthony King

(57) ABSTRACT

A method for managing defect blocks in a non-volatile memory essentially comprises the steps of detecting defect blocks in the non-volatile memory, storing addresses of the defect blocks in a table block of the non-volatile memory, and setting the non-volatile memory to be read-only if the quantity of defect blocks in the non-volatile memory exceeds a threshold and no free blocks remain in the non-volatile memory. In a preferred embodiment, the free pages in the defect block continue to be programmed before setting the non-volatile memory to be read-only.

17 Claims, 3 Drawing Sheets

Defect Block

| | |
|---|---|
| Page 0 | FF FF FF FF FF FF FF FF FF FF FF FF FF FF FF FF FF FF |
| Page 1 | 00 00 00 00 00 00 00 00 00 00 00 00 00 00 00 00 00 00 |
| Page 2 | FF FF FF FF FF FF FF FF FF FF FF FF FF FF FF FF FF FF |
| ⋮ | |
| Last Page | 00 00 00 00 00 00 00 00 00 00 00 00 00 00 00 00 00 00 |

FIG. 3

METHOD FOR MANAGING DEFECT BLOCKS IN NON-VOLATILE MEMORY

BACKGROUND OF THE INVENTION (A) Field of the Invention

The present invention relates generally to a non-volatile memory with flash erase capability, such as electrically erasable programmable read only memory (EEPROM, hereinafter referred to as flash memory), and more specifically to a method for managing areas in the non-volatile memory that are defective.

(B) Description of Related Art

A flash memory such as a RAM (random access memory), a ROM (read only memory) or a hard disk is a device for storing data therein. The flash memory comprises a plurality of blocks and erase operations are performed on a block basis.

Each block of the flash memory is limited in the number of times the data therein can be erased. Thus, if the number of times a block of the flash memory has been erased exceeds the limited number of erasures as predetermined when it was manufactured, the concerned block turns bad or defective. A flash memory such as NAND flash memory may be manufactured with some bad blocks. Taking this into consideration, the manufacturer directs users how to find the bad blocks therein. When a read operation is performed in a block of a flash memory, data different from the data previously written in the block of the flash memory may be read. The presence of the bad blocks may cause troubles when reading the flash memory.

To avoid reading wrong data in the defect blocks, management information for the bad blocks is needed. This management information may be stored in separate memories such as a RAM or an EEPROM. However, when the management information is stored in the RAM, the information stored in the RAM may be entirely lost if power failure occurs during erasure of the flash memory. When the management information is stored in a separate memory such as EEPROM, the cost to construct a system increases, and the system is accordingly complicated.

SUMMARY OF THE INVENTION

A storage device using a non-volatile memory such as a flash memory may be broken while programming. When a flash memory has many defect blocks and no more free blocks for writing new data, the user will read incorrect data if data writing to the defect blocks continues.

In order to resolve the problem as mentioned above, the present invention provides a method for managing defect blocks in a non-volatile memory. The method essentially comprises the steps of detecting defect blocks in the non-volatile memory, storing addresses of the defect blocks in a table block of the non-volatile memory, and setting the non-volatile memory to be read-only if the quantity of defect blocks in the non-volatile memory exceeds a threshold and there are no free blocks in the non-volatile memory. The table block can be selected or allocated first, and the stored table will be named as original defect block table (ODBT) in the following embodiments.

In a preferred embodiment, if some defects are found in the defect block, there may still be free pages in the defect block, which can still be programmed. Accordingly, even if a defect is detected in a defect block, the free pages in the defect block still continue to be programmed or written before setting the non-volatile memory to be read-only.

According to the present invention, the ODBT is a block contained in the flash memory, so that a further separate memory to store the ODBT is not necessary. Furthermore, the blocks will not be erased or written anymore if defects are detected therein; therefore reading of wrong data can be avoided.

BRIEF DESCRIPTION OF THE DRAWINGS

FIG. 3 illustrates an embodiment of the bytes of the pages in a defect block according to an embodiment of the present invention.

DETAILED DESCRIPTION OF THE INVENTION

Embodiments of the present invention will now be described with reference to the accompanying drawings. A flash memory with defect block management mechanism is exemplified as follows.

A general concept of the present invention is to prevent the reading of wrong data in defect blocks. Therefore, if defect blocks can be marked and so avoid being written, the reading accuracy will increase accordingly.

Figure 1:
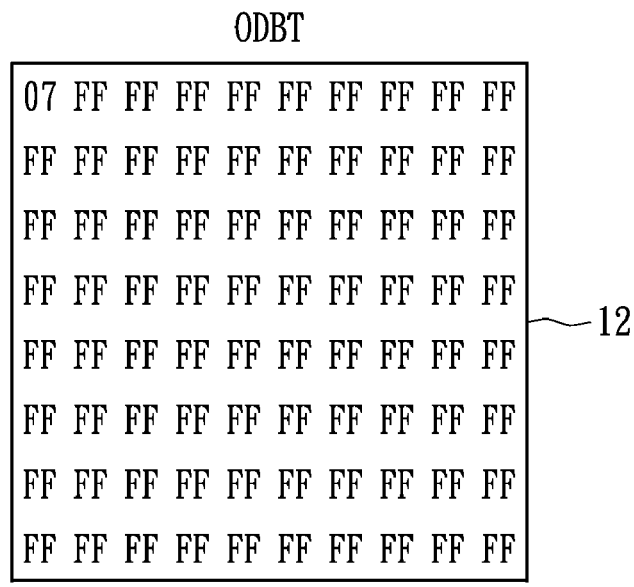
FIG. 1 and FIG. 2 illustrate an original defect block table (ODBT) according to an embodiment of the present invention.

As shown in FIG. 1, a special block in a flash memory is allocated to record the addresses of defect blocks and is named an original defect block table (ODBT) 12. In this embodiment, the mark "07 FF" indicates the address of ODBT. The block allocated to ODBT need be marked a defect block because data cannot be written in ODBT.

Figure 2:
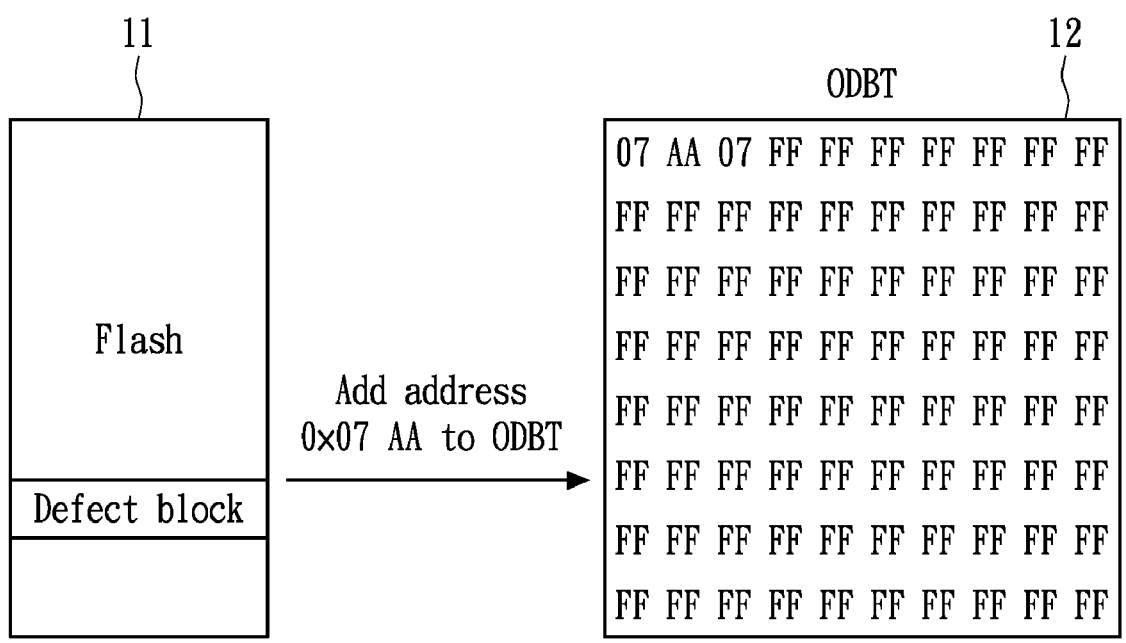

Referring to FIG. 2, in a flash memory 11, an ODBT 12 is selected to record addresses of defect blocks therein. If a controller for controlling the flash memory 11 detects one or more defect blocks while erasing or reading, the corresponding block address or block addresses are added to the ODBT and all bytes in the defect pages of the defect block or blocks are set to a number such as 0xFF, and the bytes of the other pages of defect block or blocks still keep the previous values. In this example, a defect is found in the block of the address 0x07 AA, therefore 0x07 AA is recorded in the ODBT 12.

A defect block rate is calculated to define the rate of defect blocks of the entire flash memory. The controller will check the defect block rate and free block number each time before programming. The programming includes erasing and page programming. If the defect block rate is more than a predetermined value, i.e., the quantity of defect blocks in the non-volatile memory exceeds a threshold, and there are no free blocks in the flash memory, the controller will set the flash memory to a read-only mode. Accordingly, the blocks without defect block addresses continue to be programmed, erased or read, and the blocks with defect block addresses will not be programmed or erased anymore and are read-only (R/O).

Figure 4:
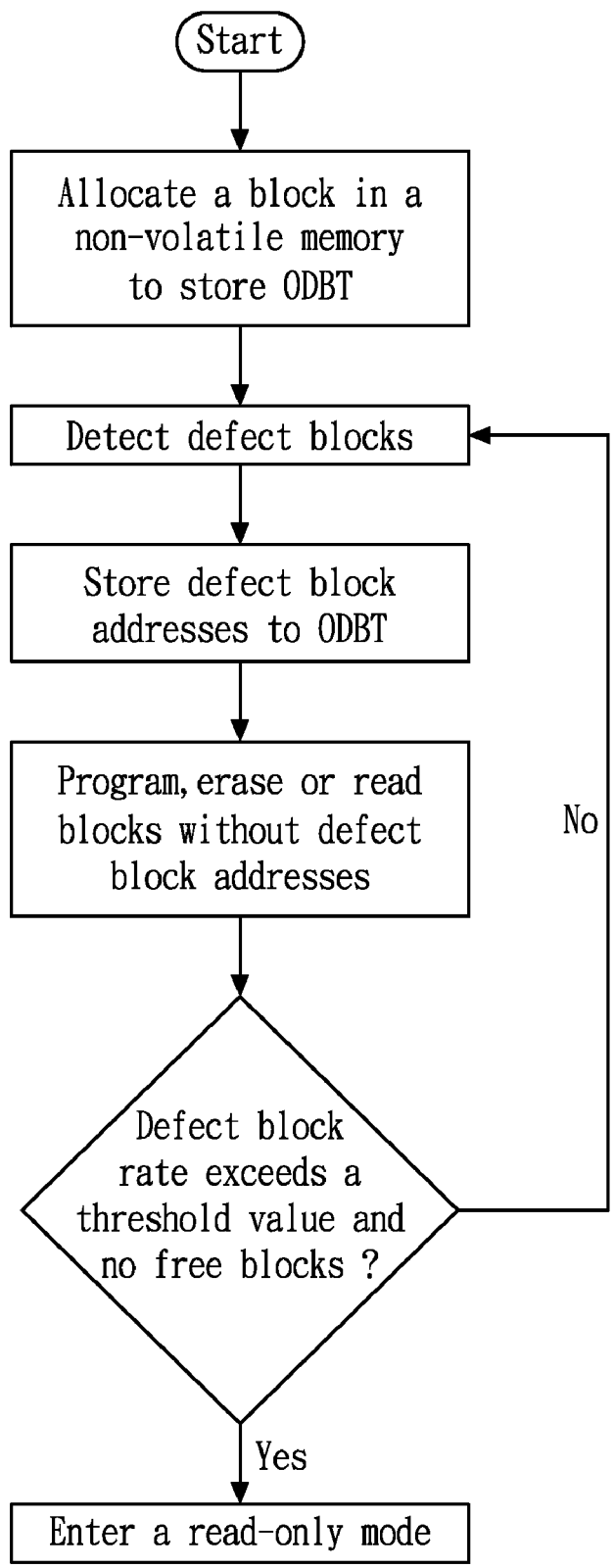
FIG. 4 illustrates a flow chart of the method for managing defect blocks in a non-volatile memory according to an embodiment of the present invention.

The method for managing defect blocks in a non-volatile memory as mentioned is illustrated by the flow chart of FIG. 4. First, a block in the non-volatile memory is allocated to store the ODBT. If defect blocks are detected, the corresponding defect block addresses are stored in the ODBT. The blocks without defect block addresses continue to be programmed, erased or read, and the detection of defect blocks continues.

When the defect block rate exceeds a threshold and no free block exists, the entire non-volatile memory is changed to a read-only mode.

In a preferred embodiment, although some defects are found in the defect block, there may still be free pages in the defect block, which can still be programmed. If the controller detects defect pages while page programming, the block address of the defect block is added to the ODBT and all bytes in the defect pages of the defect block are set to a number such as 0xFF. In an embodiment, Page 0 and Page 2 are defect pages; therefore, the bytes of Page 0 and Page 2 are set to 0xFF. Accordingly, even if a defect is detected in a defect block, the free pages in the defect block still continue to be written. In such case, the controller will set the flash memory into a "pre-read-only mode" before entering the "read-only mode." In the "pre-read-only mode," when an erase command is received by the controller, nothing will be erased; when a write command is received by the controller, only the pages in the defect blocks without bytes set to 0xFF are written, and read commands are carried out normally. When there are no free or empty pages in the defect blocks, a controller will set the flash memory to enter a read-only mode. When the flash memory is in read-only mode, although write commands and erase commands are accepted by a controller, nothing is written or erased and only read commands are carried out.

According to the present invention, the defect blocks or the blocks having defect pages are marked by their block addresses that are stored in the ODBT. The ODBT is a block contained in the flash memory, so that a further separate memory is not necessary. Furthermore, the blocks will not be erased or written anymore if defects are detected therein; therefore, reading of incorrect data can be avoided.

The above-described embodiments of the present invention are intended to be illustrative only. Numerous alternative embodiments may be devised by those skilled in the art without departing from the scope of the following claims.

What is claimed is:

1. A method for managing defect blocks in a non-volatile memory, comprising the steps of:
    detecting defect blocks in the non-volatile memory;
    storing addresses of the defect blocks in a table block of the non-volatile memory; and
    setting the non-volatile memory to be read-only if the quantity of defect blocks in the non-volatile memory exceeds a threshold and no free blocks remain in the non-volatile memory.

2. The method of claim 1, wherein detecting defect blocks in the non-volatile memory is performed while erasing.

3. The method of claim 1, wherein all bytes in the defect blocks are set to hold a number.

4. The method of claim 3, wherein the number is 0xFF.

5. The method of claim 1, wherein detecting defect blocks in the non-volatile memory comprises detecting a defect page in the defect blocks while page programming.

6. The method of claim 5, wherein the non-volatile memory is set to be read-only if there are no free pages in the defect blocks.

7. The method of claim 5, wherein all bytes in the defect page are set to hold a number.

8. The method of claim 7, wherein the number is 0xFF.

9. The method of claim 7, further comprising a step of programming any pages in the defect blocks not set to be the number.

10. A method for managing defect blocks in a non-volatile memory, comprising the steps of:
    allocating a block to store a table for recording defect block addresses of defect blocks in the non-volatile memory;
    detecting the defect blocks in the non-volatile memory;
    storing the defect block addresses in the table;
    programming or erasing those blocks without defect block addresses; and
    setting the non-volatile memory to be read-only if the quantity of defect blocks in the non-volatile memory exceeds a threshold and no free blocks remain in the non-volatile memory.

11. The method of claim 10, wherein detecting defect blocks in the non-volatile memory is performed while erasing.

12. The method of claim 10, wherein detecting defect blocks in the non-volatile memory comprises detecting a defect page in the defect blocks while page programming.

13. The method of claim 12, wherein the non-volatile memory is set to be read-only if there are no free pages in the defect blocks.

14. The method of claim 12, wherein all bytes in the defect page are set to hold a number.

15. The method of claim 14, further comprising a step of programming pages in the defect blocks whose bytes are not the number.

16. A method for managing defect blocks in a non-volatile memory, comprising the steps of:
    allocating a block to store a table for recording defect block addresses of defect blocks in the non-volatile memory;
    detecting defect pages in defect blocks in the non-volatile memory;
    storing the defect block addresses of defect blocks in the table;
    setting all bytes in the defect pages to hold a number;
    writing pages in the defect blocks whose bytes are not the number; and
    setting the non-volatile memory to be read-only if the quantity of defect blocks in the non-volatile memory exceeds a threshold, no free blocks remain in the non-volatile memory, and pages in the defect block have been written completely.

17. The method of claim 16, wherein detecting the defect pages in the defect blocks is performed while page programming.

* * * * *